(12) United States Patent
Carminati et al.

(10) Patent No.: US 9,670,056 B2
(45) Date of Patent: Jun. 6, 2017

(54) ELECTROSTATICALLY DRIVEN MEMS DEVICE

(71) Applicant: STMicroelectronics S.r.l., Agrate Brianza (IT)

(72) Inventors: Roberto Carminati, Piancogno (IT); Sebastiano Conti, Mistretta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 91 days.

(21) Appl. No.: 14/607,714

(22) Filed: Jan. 28, 2015

(65) Prior Publication Data
US 2015/0217990 A1  Aug. 6, 2015

(30) Foreign Application Priority Data
Jan. 31, 2014 (IT) .............................. TO2014A0077

(51) Int. Cl.
*B81B 3/00* (2006.01)
*B81B 7/00* (2006.01)
(Continued)

(52) U.S. Cl.
CPC ............ *B81B 3/0062* (2013.01); *B81B 7/008* (2013.01); *G02B 26/0841* (2013.01); *G03B 21/142* (2013.01); *G03B 21/2033* (2013.01); *G03B 21/28* (2013.01); *B81B 2201/018* (2013.01); *B81B 2201/033* (2013.01); *B81B 2201/042* (2013.01); *B81B 2201/045* (2013.01); *B81B 2203/058* (2013.01)

(58) Field of Classification Search
CPC ............ G02B 26/0825; G02B 26/0841; G02B 26/101; G02B 26/121; G02B 26/105; B81B 3/00; B81B 3/0062; G03B 21/14; G03B 21/20; G03B 21/28; G03B 21/142; G03B 21/2033
See application file for complete search history.

(56) References Cited

U.S. PATENT DOCUMENTS 6,360,033 B1  3/2002  Lee et al.
2005/0117235 A1  6/2005  Ko et al.
(Continued)

FOREIGN PATENT DOCUMENTS

CN  1873464 A  12/2006
CN  102648150  8/2012
(Continued)

*Primary Examiner* — Jennifer L. Doak
(74) *Attorney, Agent, or Firm* — Seed Intellectual Property Law Group LLP

(57) ABSTRACT

The MEMS device has a suspended mass supported via a pair of articulation arms by a supporting region. An electrostatic driving system, coupled to the articulation arms, has mobile electrodes and fixed electrodes that are coupled to each other. The electrostatic driving system is formed by two pairs of actuation assemblies, arranged on opposite sides of a respective articulation arm and connected to the articulation arm through connection elements. Each actuation assembly extends laterally to the suspended mass and has an auxiliary arm carrying a respective plurality of mobile electrodes. Each auxiliary arm is parallel to the articulation arms. The connection elements may be rigid or formed by linkages.

26 Claims, 8 Drawing Sheets

(51) Int. Cl.
  *G02B 26/08* (2006.01)
  *G03B 21/14* (2006.01)
  *G03B 21/20* (2006.01)
  *G03B 21/28* (2006.01)

(56) References Cited

U.S. PATENT DOCUMENTS

2006/0279169 A1   12/2006  Yoda et al.
2011/0080627 A1*   4/2011  He .................. B81B 3/0062
                                              359/224.1
2011/0234898 A1    9/2011  Goren
2012/0062973 A1    3/2012  Medina et al.
2012/0228996 A1    9/2012  Suzuki

FOREIGN PATENT DOCUMENTS

WO   2010/067354 A1   6/2010
WO   2010/137009 A1   12/2010

* cited by examiner

ELECTROSTATICALLY DRIVEN MEMS DEVICE

BACKGROUND

Technical Field

The present invention relates to a microelectromechanical (MEMS) device having a driving structure of an electrostatic type.

Description of the Related Art

As is known, picoprojectors have been proposed having a pair of MEMS micromirrors, each driven for rotating about an own rotation axis.

For instance, in the system illustrated schematically in FIGS. 1 and 2, a light source 1, typically a laser source, generates a beam of light 2 (generally including three monochromatic beams, one for each basic color), which, through an optics 3 illustrated only schematically, is deflected by a pair of MEMS mirrors 5, 6. For instance, the first MEMS mirror 5 may be a horizontal micromirror, of a resonant type, which rotates about a first axis A (FIG. 2) and generates a fast horizontal scan, and the second MEMS mirror 6 may be a vertical micromirror, which rotates about a second, transverse, axis B, in particular perpendicular to the first axis A, and generates a slow vertical scan, typically a sawtooth scan. The combination of the movements of the two MEMS mirrors 5, 6 causes the beam of light 2 to perform a complete two-dimensional scanning movement and, once projected on a projection screen 7, to generate a two-dimensional image thereon. Such a system is described, for example, in WO 2010/067354, which was also published as US 2011/0234898, which is hereby incorporated by reference in its entirety for all purposes.

For ideal projection of the image, it is desired to perform the vertical scan at a constant rate. Consequently, it has already been proposed to control the movement at least of the vertical micromirror 6 by an electrostatic driving system that causes controlled rotation thereof about the respective axis B.

For instance, the vertical micromirror 6 may be made as illustrated in FIG. 3. Here, a die 10 comprises a reflecting surface 11 suspended on a substrate (not visible) and supported by a pair of arms 12. The arms 12 extend on opposite sides of the reflecting surface 11 and define the rotation axis B of the vertical micromirror 6. The arms 12 are connected to a fixed peripheral portion 13 of the die 10 via torsion springs 14 that enable rotation of the arms 12 about the axis B. The arms 12 are further coupled to a driving structure formed by two actuation assemblies 18 of an electrostatic type, one for each arm 12. Each actuation assembly 18 here comprises two sets of mobile electrodes 19 facing as many sets of fixed electrodes 20.

In detail, the mobile electrodes 19 are fixed with respect to the arms 12 and are comb-fingered with the fixed electrodes 20 for generating a capacitive coupling. The fixed electrodes 20 are carried by supporting regions 21, generally fixed with respect to the substrate (not visible) of the die 10. By virtue of the arrangement of the electrodes 19, 20, the driving structure is also defined as "comb drive structure".

The mobile electrodes and the fixed electrodes 20 may be formed in different layers of the die 10 so as to extend at different heights, as described for example in WO 2010/137009, which was also published as US 2012/0062973, which is hereby incorporated herein by references in its entirety for all purposes, and as illustrated in the enlarged detail of FIG. 4.

By applying appropriate voltages between the mobile electrodes 19 and the fixed electrodes 20, it is possible to generate attraction or repulsion forces between them for causing a rotation of the mobile electrodes 19 with respect to the fixed electrodes 20, a torsion of the arms 12 about axis B, and thus a corresponding controlled rotation of the reflecting surface 11 (FIG. 5).

The described structure is in contrast, however, with the current demand for increasingly large mirrors.

In fact, in optical systems, the number of pixels of the images projected is proportional to the diameter of the reflecting surface 11.

It follows that, in the field of picoprojectors, it is desirable to have micromirrors of increasingly large dimensions, both in order to increase resolution of the projected image and to meet market demand, moving towards high-definition standards (720 pixels; 1080 pixels).

In particular, in two-dimensional picoprojectors, the diameter of the horizontal micromirror determines the resolution. On the other hand, the increase of the dimensions of the horizontal micromirror also determines a drastic increase of the dimensions of the vertical micromirror on account of the larger scanning-spot trace thereon.

To provide a reflecting surface 11 of larger dimensions, it is possible to use a higher actuation voltage, since the resonance frequency is set by the conditions and constraints of the system. In particular, in the case of electrostatic comb driving of the considered type, this entails a modification of the operating voltage and thus an increase in the number of electrodes.

With the structure of FIGS. 3-5, the increase in the dimensions of the reflecting surface 11 results in a significant increase in the dimensions of the entire die 10 in the direction of the rotation axis B, since not only the length of the reflecting surface 11 increases in this direction, but also the number of pairs of comb-fingered electrodes 19, 20.

The above increase is in contrast with the current trend towards miniaturization and entails considerable costs, in particular in the case of applications at a modest production scale, where it is not desired to exploit to the full the potential of mass production.

This problem exists, on the other hand, also in other types of MEMS devices, of the type referred to above.

BRIEF SUMMARY

One or more embodiments of the present invention may provide a MEMS device having a torsional driving structure that overcomes one or more of the drawbacks of the prior art.

One or more embodiments are directed to a rotatable micromirror that, for example, may be mounted in a picoprojector. Another embodiment is directed to MEMS structures of an inertial type, for example elements for detecting motion parameters, such as accelerometers, gyroscopes, etc., or driving elements, such as micromotors, microactuators, or converters of rotational motion to translatory motion. In yet another embodiment, the MEMS structures is applied with translatory motion.

One embodiment is directed to a MEMS device that includes a suspended mass having a reflecting surface, a supporting region; and an articulation arm that couples the suspended mass to the supporting region. The MEMS device further includes connection elements and an electrostatic driving system. The electrostatic driving system includes first and second actuation assemblies arranged on opposite sides of the articulation arm and coupled to the articulation arm by the connection elements. Each of the first and second actuation assemblies include mobile electrodes and fixed electrodes that are mutually arranged.

BRIEF DESCRIPTION OF THE SEVERAL VIEWS OF THE DRAWINGS

For a better understanding of the present invention, preferred embodiments thereof are now described, purely by way of non-limiting example, with reference to the attached drawings, wherein.

DETAILED DESCRIPTION

Figure 1:
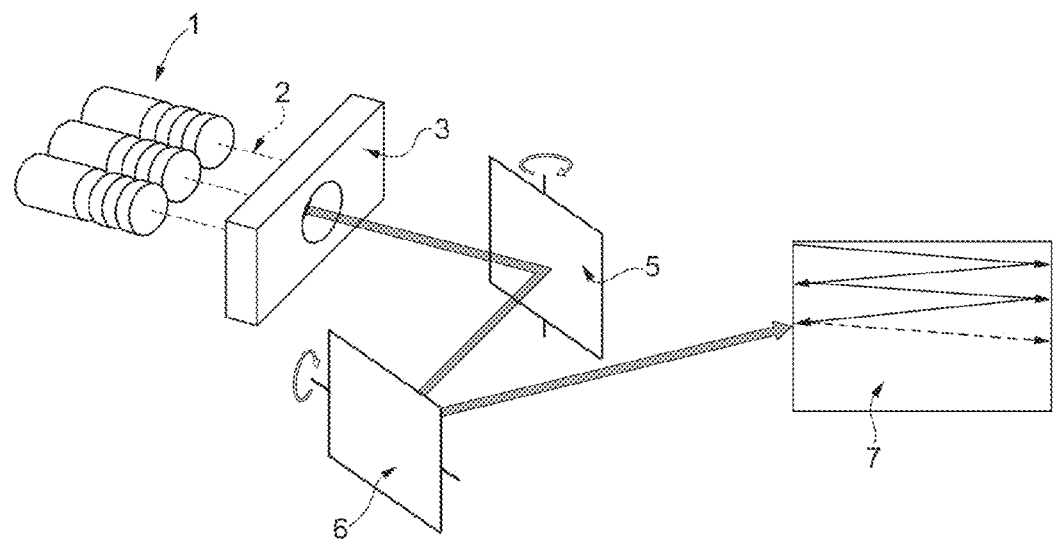
FIG. 1 is a schematic perspective view of a picoprojector.
Figure 2:
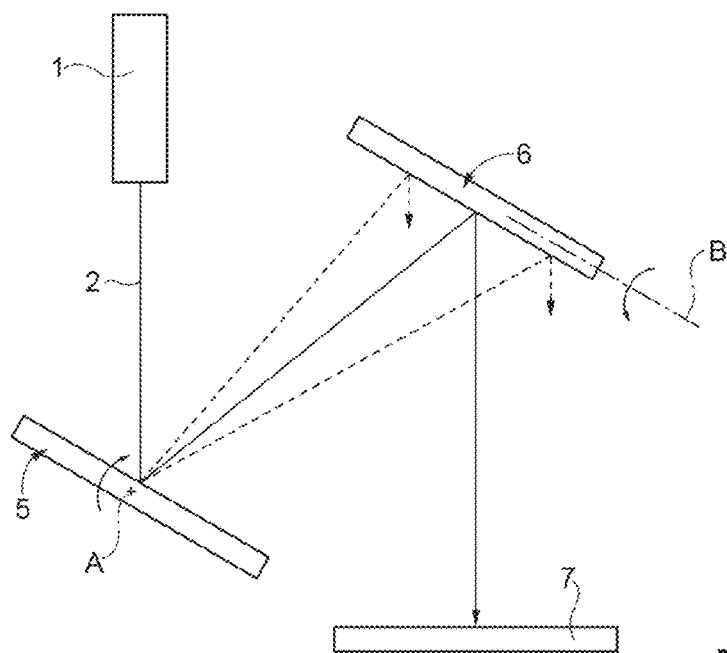
FIG. 2 is a schematic illustration of the movement of deflection of the micromirrors of the picoprojector of FIG. 1.
Figure 3:
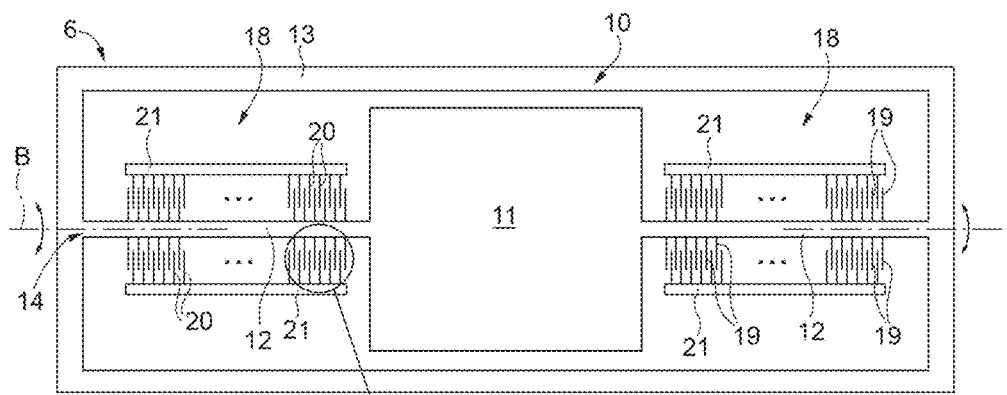
FIG. 3 is a schematic illustration of an embodiment of the vertical micromirror of FIG. 1.
Figure 4:
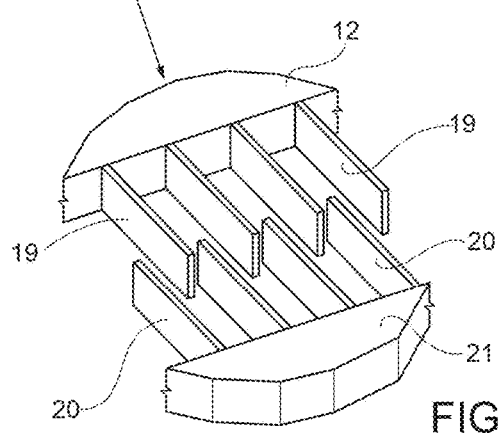
FIG. 4 is an enlarged perspective view of a detail of the micromirror of FIG. 3.
Figure 5:
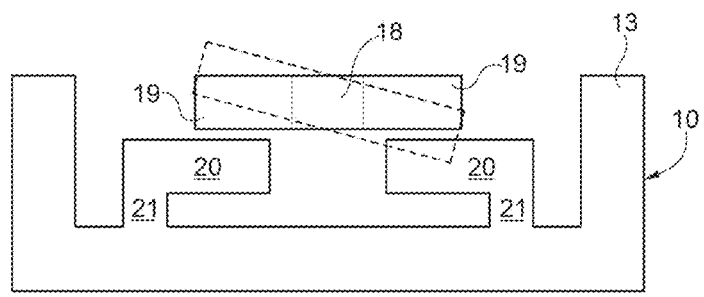
FIG. 5 is a cross-sectional view of a portion of the micromirror of FIG. 3.
Figure 6:
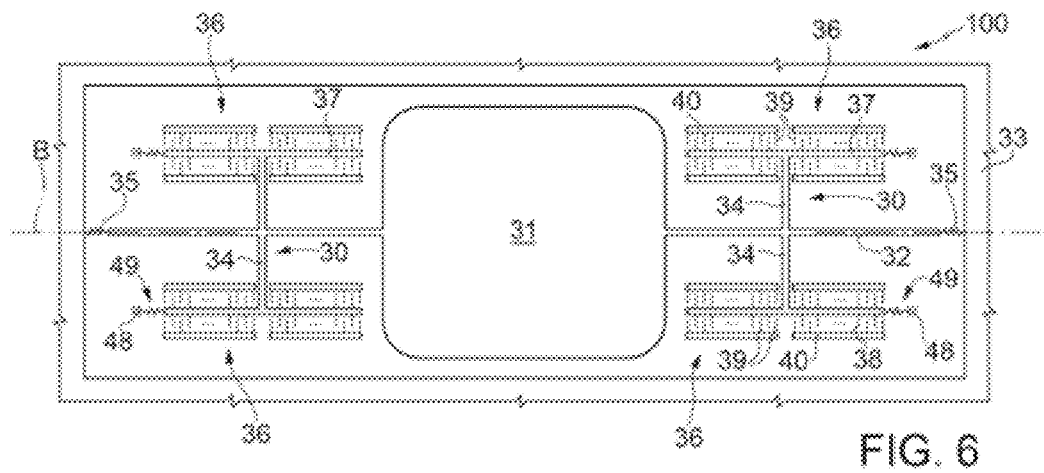
FIG. 6 is a simplified top plan view of an embodiment of the present MEMS structure.
Figure 7:
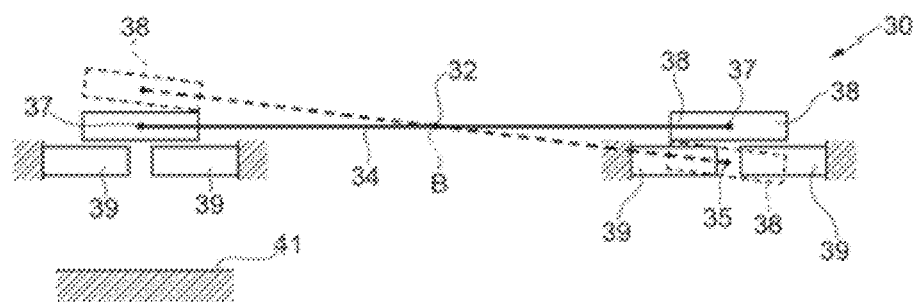
FIG. 7 is a schematic illustration of the driving principle of the MEMS structure of FIG. 6.

FIGS. 6-7 show a MEMS device 100, forming here a micromirror for a picoprojector of the type illustrated in FIGS. 1 and 2.

MEMS device 100 comprises a suspended mass 31, here a reflecting surface having a generally rectangular shape, supported by two articulation arms 32. The articulation arms 32 extend aligned to each other on opposite sides of the suspended mass 31 along a rotation axis B and are constrained at their ends to a fixed region 33 of the MEMS device 100 through first torsion springs 35.

Actuation assemblies 36 are connected to the articulation arms 32 through connection elements 30 and control rotation thereof (together with that of the suspended mass 31 fixed with respect thereto) about the rotation axis B.

The connection elements 30 are here formed by rigid arms 34, which extend from intermediate portions of each articulation arm 32, from each side thereof, in a transverse (substantially perpendicular) direction with respect to the articulation arms 32 and each carries a respective auxiliary arm 37. The auxiliary arms 37 extend in a direction transverse (substantially perpendicular) with respect to the rigid arms 34 and thus substantially parallel to the articulation arms 32. In the example illustrated, thus four rigid arms 34 and four auxiliary arms 37 are shown. The auxiliary arms 37 carry respective mobile electrodes 38, which extend in a direction transverse (in particular, substantially perpendicular) with respect to the auxiliary arms 37, on each side thereof. Furthermore, the mobile electrodes 38 extend on both sides of the rigid arms 34, in a substantially symmetrical configuration.

The mobile electrodes 38 face, and are comb-fingered with, respective fixed electrodes 39, here carried by and connected together via fixed regions 40. Consequently, the mobile electrodes 38 are capacitively coupled to the respective fixed electrodes 39 and form a plurality of mobile-electrode 38/fixed-electrode 39 pairs.

In some embodiments, for considerations of symmetry and stress uniformity, each actuation assembly 36 comprises an equal number of mobile electrodes 38 and an equal number of fixed electrodes 39.

As a whole, thus, the mobile electrodes 38 carried by the same auxiliary arm 37 and the fixed electrodes 39 facing them form four actuation assemblies 36, each carried by a respective articulation arm 32. In this connection, it is emphasized that the term "actuation assembly" here denotes a plurality of mobile-electrode/fixed-electrode pairs that, when appropriately biased, exert a couple of opposed forces that tend to cause rotation of the respective auxiliary arm 37 in the same direction.

As compared to solutions in which the mobile electrodes of the actuation assemblies are provided directly on the articulation arms, the connection elements 30 and the auxiliary arms 37 enable at least doubling the number of actuation assemblies 36, with a same overall axial dimensions of the MEMS device 100 (length in the direction of the rotation axis B), as well as same dimensions and distance of each mobile-electrode 38/fixed-electrode 39 pair.

Furthermore, a particularly compact solution is obtained by arranging the actuation assemblies 36 laterally to the suspended mass 31, in the rectangular area defined by the axial length of the MEMS device 100 and by the width of the suspended mass 31 (in the direction perpendicular to the axial length). Furthermore, this arrangement affords a greater stiffness of the MEMS device, which is thus more resistant to impact and stress, since, compared to a classic structure, a larger number of elastic elements (springs) and anchorages to rigid parts is present.

FIG. 7 shows a simplified diagram of the operating principle of the MEMS device 100, represented in cross-section through one of the articulation arms 32 and along the two rigid arms 34 carried thereby. In a per se known manner, by applying appropriate voltages between the mobile electrodes 38 and the fixed electrodes 39 of each actuation assembly, it is possible to generate attraction forces between them and thus concordant rotation of the auxiliary arms 37, of the rigid arms 34, and thus of the articulation arms 32 and of the suspended mass 31, about the rotation axis B.

In FIG. 7, the mobile electrodes 38 and the fixed electrodes 39 are arranged at different heights from each other, and the resting position of the MEMS device 100 is represented with a solid line (articulation arms 32 not rotated and suspended mass 31 parallel to the substrate designated as a whole 41), whereas a possible rotated position is represented with a dashed line (in an exaggerated way).

Figure 8:
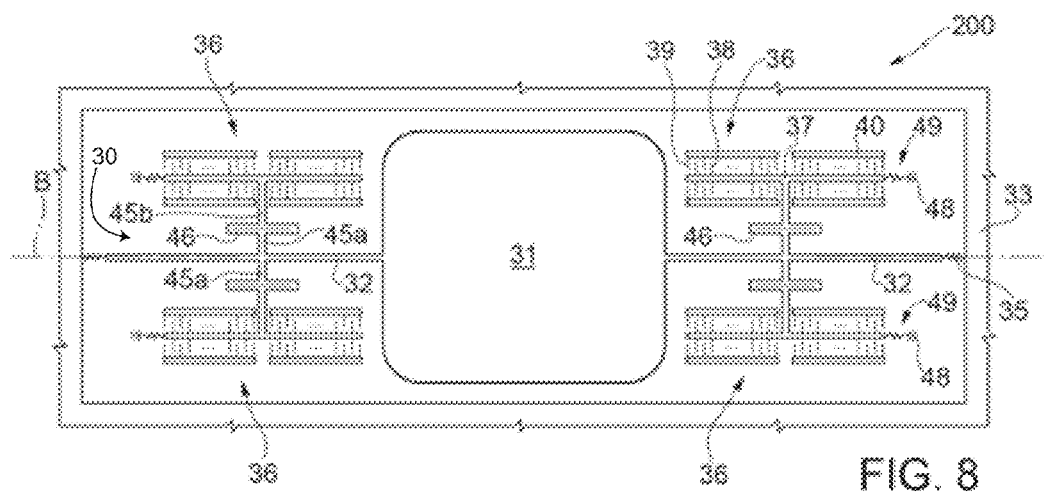
FIG. 8 is a simplified top plan view of another embodiment of the present MEMS structure.
Figure 9:
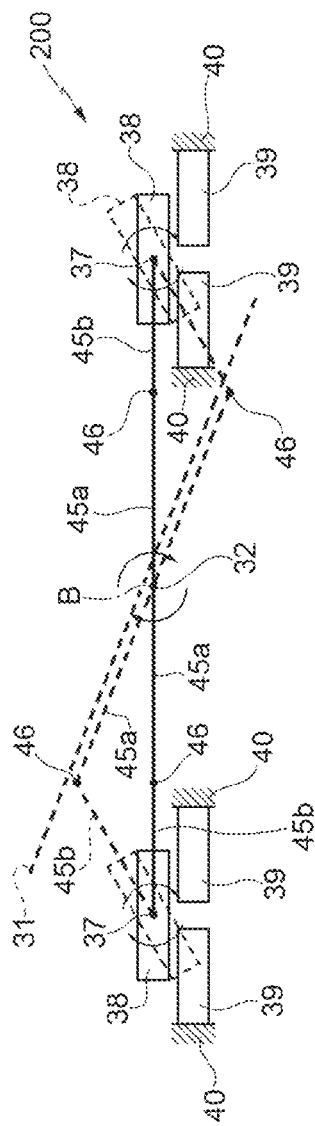
FIG. 9 is a schematic illustration of the driving principle of the MEMS structure of FIG. 8.
Figure 10:
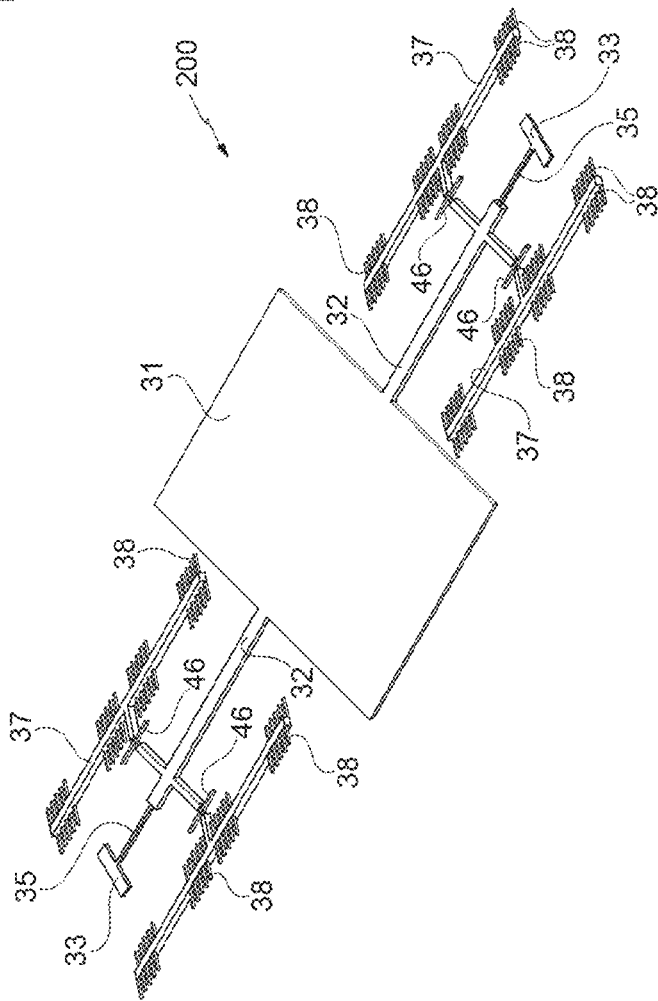
FIG. 10 is a simplified perspective view of the MEMS structure of FIG. 8, in a rotated position.

In the MEMS device 200, illustrated in FIGS. 8-10, the connection elements 30 form systems of levers and hinges that enable transfer of the mechanical torque generated by the actuation assemblies 36 to the oscillation arms 32 and to the suspended mass 31 without requiring a vertical movement of the mobile electrodes 38 and of the corresponding auxiliary arms 37.

In particular (see FIG. 8), here each connection element 30 is formed by two levers 45a, 45b, articulated together at a hinge element 46 and extending between a respective articulation arm 32 and a respective auxiliary arm 37. In detail, two first levers 45a extend from each articulation arm 32, rigidly constrained thereto, and each first lever 45a is articulated to the respective second lever 45b, which is in turn rigidly connected to a respective auxiliary arm 37. Furthermore, each auxiliary arm 37 is articulated at its own ends to a fixed region 48 of the MEMS device 100 through respective second torsion springs 49.

FIG. 9 shows a simplified diagram of the operating principle of the MEMS device 200, in the case referred to above of mobile electrodes 38 and fixed electrodes 39 arranged at two different heights. As may be noted, by applying appropriate voltages between the pairs of mobile electrodes 38 and the facing fixed electrodes 39, the auxiliary arms 37 rotate in a first direction (for example, here in a counterclockwise direction), causing a similar rotation of the second lever elements 45b about their ends constrained to the auxiliary arms 37 and an opposite rotation, in a second direction, of the first lever elements 45a (here in a clockwise direction). Consequently, also the articulation arms 32 and the suspended mass 31 rotate in the second direction.

The movement of the MEMS device 200 further emerges clearly from the simplified perspective view of FIG. 10.

Since in FIGS. 8-10 the auxiliary arms 37 may rotate about the respective longitudinal axes and not translate, there is a stronger coupling between the mobile electrodes 38 and the fixed electrodes 39 facing them. The MEMS device 200 thus enables obtaining larger rotation angles with respect to the MEMS device 100 of FIG. 7, as well as a greater efficiency.

Figure 11:
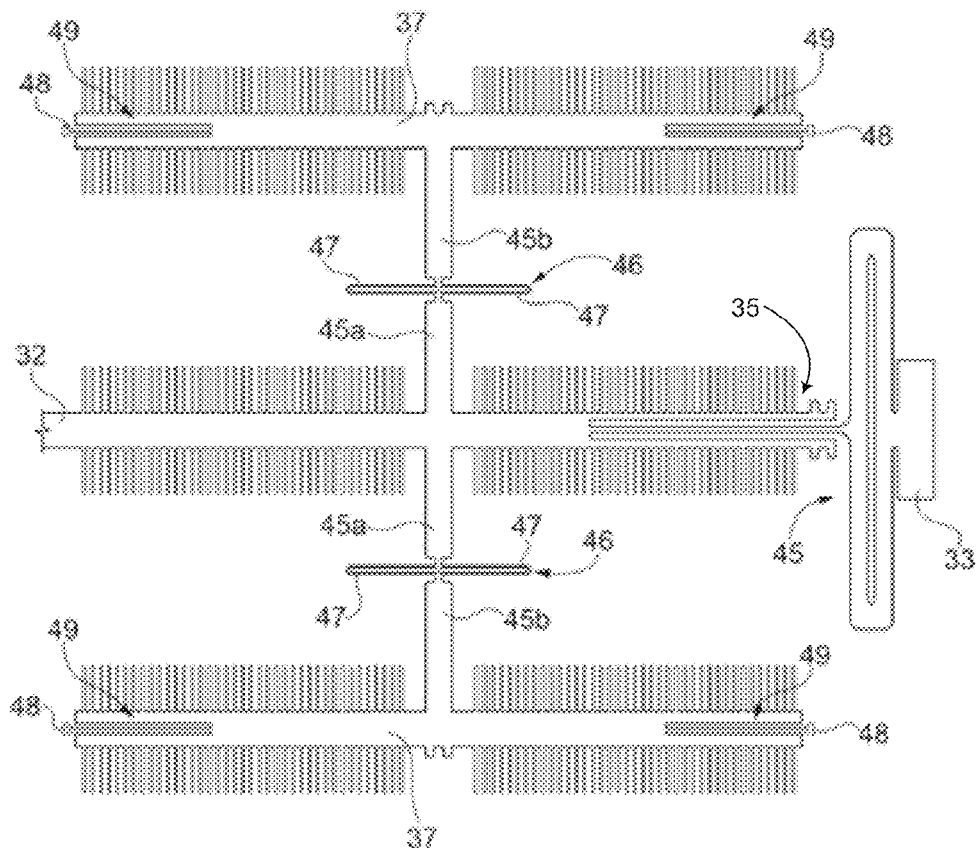
FIG. 11 is an enlarged top plan view of a portion of the MEMS structure of FIG. 8.

FIG. 11 shows an embodiment of the first torsion springs 35, of the second torsion springs 49, and of the hinges 46 of the MEMS device 200 of FIGS. 8-10. In particular, the hinges 46 are formed by thinned-out portions of material, suspended over the substrate 41, roughly shaped like two opposed U-shapes 47. The ends of the U-shapes 47 are connected together and to the levers 45a, 45b for enabling both a mutual rotation of the levers 45a, 45b about rotation axes that are parallel to the articulation arms 32 (thus each operating as torsion spring) and a relative movement of the facing ends of the levers 45a, 45b away from each other during rotation, as is evident from the view of FIG. 9 (thus each operating also as tension spring).

Figure 12:
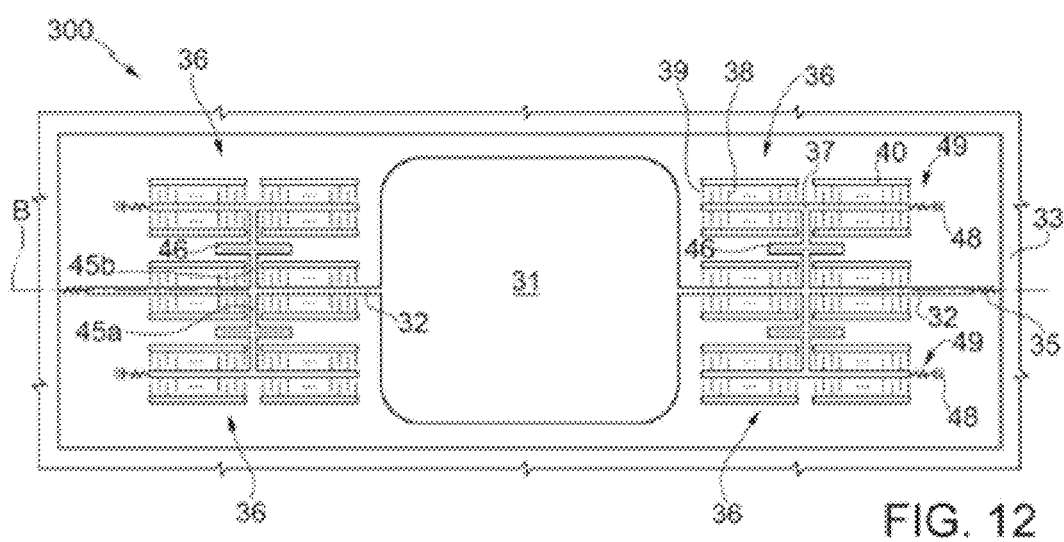
FIGS. 12 and 13 are simplified top plan views of other embodiments of the present MEMS structure.

FIG. 12 shows a MEMS device 300 having two additional actuation assemblies 36 than the embodiment of FIGS. 8-10. The mobile electrodes 38 of the two additional actuation assemblies 36 of FIG. 12 are formed directly on the articulation arms 32.

In this way, the MEMS device 300 triplicates the number of available actuation assemblies, for a same space.

In practice, with the solution of FIG. 12, in some reference designs, all other conditions being equal, for a suspended mass 31 having a diameter of 3 mm, it is possible to reduce the length in the direction of the rotation axis B from 21.6 to 13.3 mm, while for a suspended mass 31 having a diameter of 2.5 mm, it is possible to reduce the length in the direction of the rotation axis B from 12.6 to 9.7 mm, with a gain of up to 40% of the total area.

Figure 13:
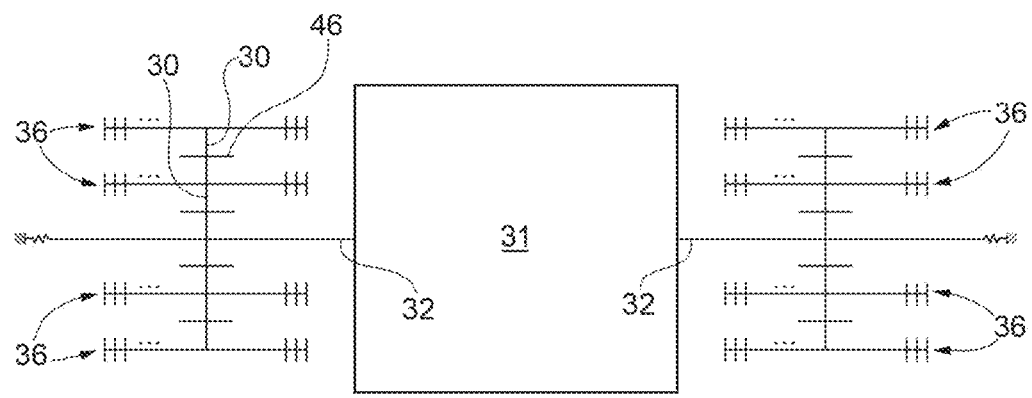

As the dimensions of the suspended mass 31 increase, it is moreover possible to add further actuation assemblies 36, in parallel to the actuation assemblies 36 and carried by further connection elements 30, as illustrated for example in FIG. 13.

Figure 14:
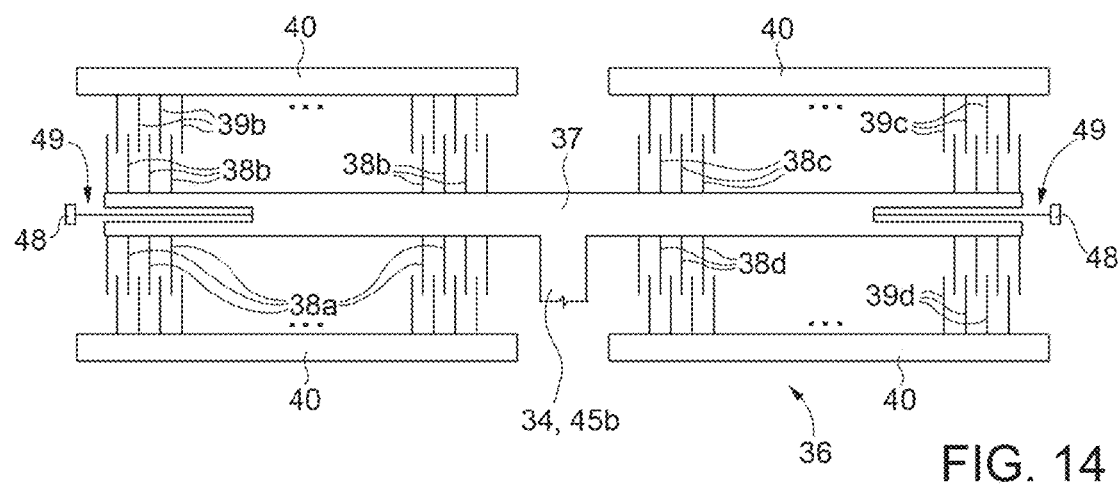
FIG. 14 is an enlarged top plan view of a detail of the present MEMS structure.

In one embodiment, the mobile electrodes 38 are not all formed in the same structural layer of the semiconductor die, but extend at different heights in the semiconductor die integrating the MEMS device; i.e., neglecting the thickness of the layers, they may define separate planes. This solution is described, for example, with reference to FIGS. 14-16.

In detail (see FIG. 14), for each actuation assembly 36, four sets of mobile electrodes 38 may be defined, identified hereinafter also as sets of mobile electrodes 38a-38d, according to the side of the respective auxiliary arm 37 and the side of the connection element 30 on which they extend.

Likewise, four sets of fixed electrodes 39a-39d are present, one for each set of mobile electrodes 38a-38d.

In practice, in the example considered, a first set of mobile electrodes 38a and a first set of fixed electrodes 39a are arranged on a first side of the connection element 30 and on a first side of the auxiliary arm 37; a second set of mobile electrodes 38b and a second set of fixed electrodes 39b are arranged on the first side of the connection element 30 and on a second side of the auxiliary arm 37; a third set of mobile electrodes 38c and a third set of fixed electrodes 39c are arranged on a second side of the connection element 30 and on the second side of the auxiliary arm 37; and a fourth set of mobile electrodes 38d and a fourth set of fixed electrodes 39d are arranged on the second side of the connection element 30 and on the first side of the auxiliary arm 37.

Figure 15:
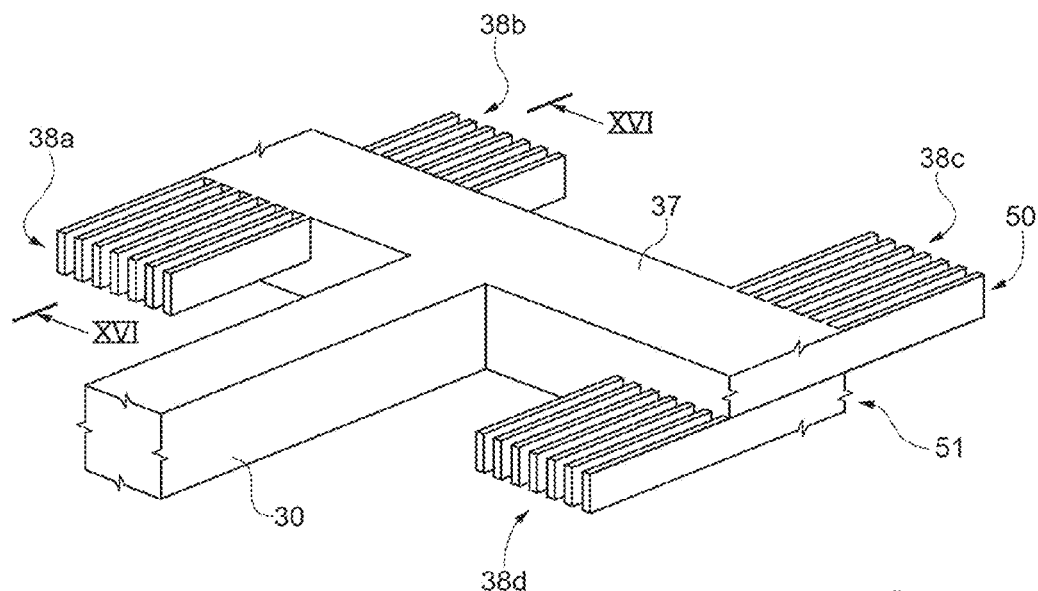
FIG. 15 is an enlarged perspective view of the detail of FIG. 14.

The mobile electrodes 38 and fixed electrodes 39 are arranged in an alternating way in different planes and in a diametrally opposite way with respect to the auxiliary arms 37, as may be seen, for example, in the detail of FIG. 15. In particular, in the example illustrated, the mobile electrodes 38 of the same set are arranged in the same plane, different from that of the respective fixed electrodes 39, as well as of the mobile electrodes of a set located on an opposite side of the auxiliary arms 37 or on an opposite side of the connection element 30, but in the same plane as the mobile electrodes 38 arranged on the opposite side of the auxiliary arms 37 and on the opposite side of the connection element 30.

Figure 16:
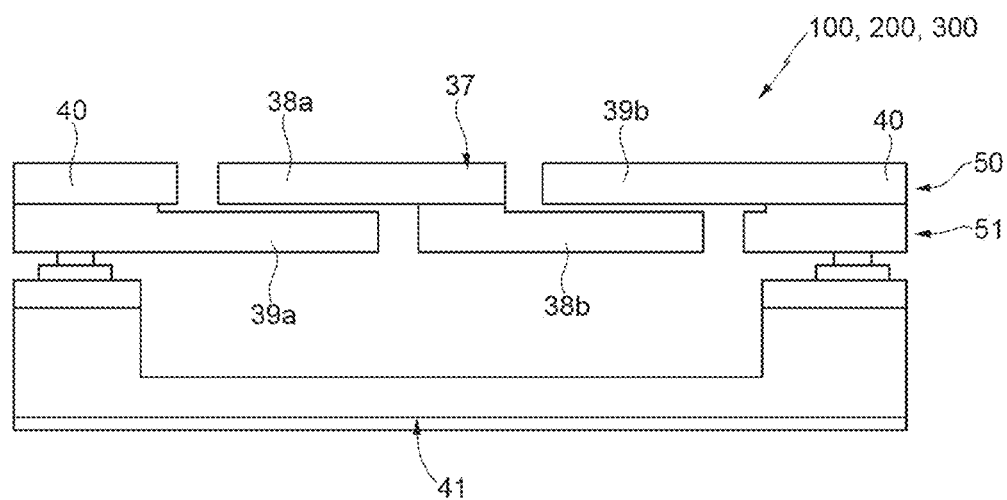
FIG. 16 is a cross-section of a semiconductor die, including a portion of the present MEMS structure.

For instance, as illustrated in FIG. 15, the mobile electrodes 38a and 38c are formed in a first structural layer 50 (for example, a higher structural layer—see also the cross-section of FIG. 16 taken through a die of semiconductor material integrating the present MEMS device). The corresponding fixed electrodes 39a and 39c (not visible in FIG. 15) are formed in a second structural layer 51 (for example, a bottom structural layer). The mobile electrodes 38b and 38d are formed in the second structural layer 51 and the fixed electrodes 39b, and 39d are formed in the first structural layer 50.

In FIG. 15, the first and second structural layers 50, 51 may be formed by two epitaxial layers (grown using techniques of epitaxial growth), each having a thickness of 40 µm.

In this way, the coupling between the mobile electrodes 38 and the fixed electrodes 39 is improved in various operating conditions.

Obviously, the arrangement of the mobile electrodes 38 and fixed electrodes 39 illustrated in FIGS. 1-16 may vary. In particular, they may be formed in the same structural layer, in particular in devices that work in resonance conditions.

Consequently, the illustrated and described MEMS devices 100, 200 and 300 have the advantage of enabling a drastic reduction of the area desired for their manufacture, and thus miniaturization of the apparatuses that contain them, in particular of microprojectors.

The MEMS devices 100, 200 and 300 may be manufactured using current MEMS manufacturing techniques and their manufacture does not entail additional costs.

They are moreover compatible with further electronic devices that may be manufactured with semiconductor techniques and enable numerous modifications and adaptations in the shape of the suspended mass, as well as in the number of masses that may be provided.

Figure 17:
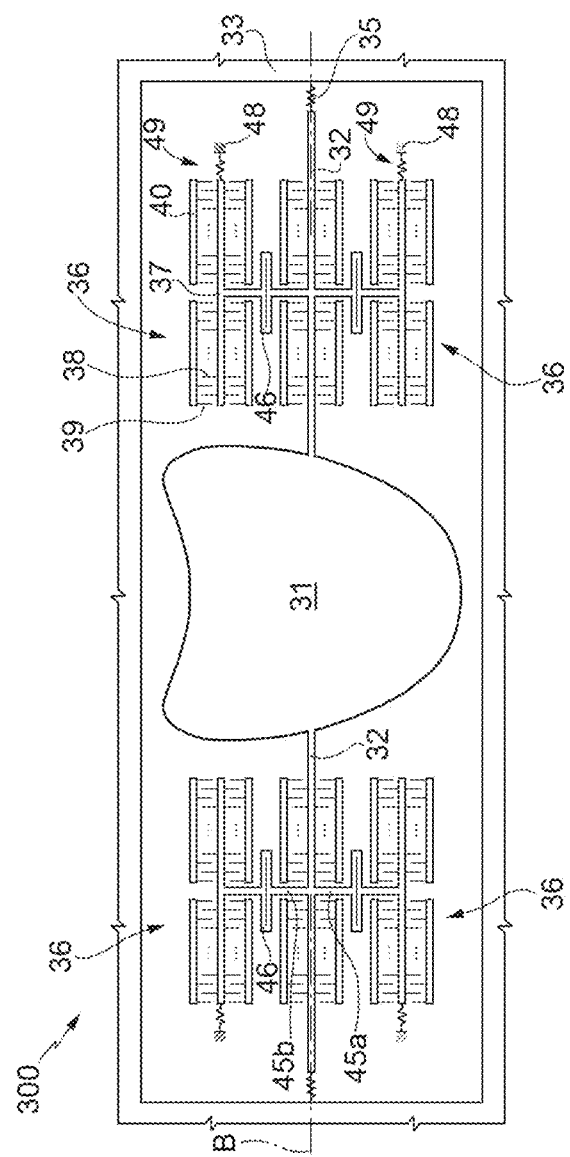
FIG. 17 shows a different embodiment.

For instance, if the suspended mass forms a reflecting surface of a micromirror, the suspended mass 31 may be heart-shaped, as illustrated in FIG. 17.

Finally, it is clear that modifications and variations may be made to the MEMS device described and illustrated herein, without thereby departing from the scope of the present invention.

For instance, the MEMS device may form not only a micromirror but also an electrostatically driven resonant device, a biaxial micromirror, or a switch.

The hinges 46 may have a different shape from what illustrated; for example, they may be formed by a single thinned-out region, having a rectilinear or curvilinear shape, either simple or complex, or else be formed by two differently shaped regions, for example V-shaped or having a more complex curvilinear shape.

The driving system using actuation assemblies 36 may enable different movements of the suspended mass 31, for example of a translatory type.

Furthermore, the actuation system could have electrodes arranged differently, for instance translating mobile electrodes, such as for example in the case of inertial sensors, and/or with actuation assemblies rotated through 90°.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device comprising:
a suspended mass;
a supporting region;
an articulation arm having a first end coupled to the suspended mass and a second end coupled to the supporting region, the articulation arm having a longitudinal axis extending from the first end to the second end, the articulation arm having opposite sides that oppose each other relative to the longitudinal axis, the articulation arm and the suspended mass being configured to rotate about the longitudinal axis;
connection elements extending from the opposite sides of the articulation arm; and
an electrostatic driving system including first and second actuation assemblies arranged on the opposite sides of the articulation arm and coupled to the articulation arm by the connection elements, respectively, each of the first and second actuation assemblies including mobile electrodes mutually arranged with fixed electrodes.

2. The MEMS device according to claim 1, wherein the first and second actuation assemblies include auxiliary arms having opposing sides, wherein the mobile electrodes extend from the opposing sides of the auxiliary arms.

3. The MEMS device according to claim 2, wherein the auxiliary arms have a longitudinal axis that is substantially parallel to the longitudinal axis of the articulation arm.

4. The MEMS device according to claim 2, wherein the connection elements are rigid arms.

5. The MEMS device according to claim 4, wherein the rigid arms have first portions coupled to the articulation arms and second portions coupled to the auxiliary arms, respectfully, hinges located at the first portions and second portions of the rigid arms, respectively, the hinges being configured to allow the first portions and the second portions to move in different directions.

6. The MEMS device according to claim 2, wherein the connection elements are each formed by a linkage that includes a pair of levers having first ends coupled to the articulation arm and to the auxiliary arm, respectively, and second ends coupled to each other by a hinge.

7. The MEMS device according to claim 6, wherein each hinge is formed by a pair of generally U-shaped regions having ends mutually coupled and coupled to the pair of levers.

8. The MEMS device according to claim 6, further comprising torsion springs and fixed regions, wherein the auxiliary arms are coupled to the fixed regions via respective torsion springs.

9. The MEMS device according to claim 1, further comprising first and second structural layers, wherein for at least one of the first and second actuation assemblies the mobile electrodes are formed in the first structural layer and the fixed electrodes are formed in the second structural layer.

10. The MEMS device according to claim 2, wherein in each actuation assembly, first mobile electrodes are formed in a first structural layer and second mobile electrodes are formed in a second structural layer, wherein the fixed electrodes mutually arranged with the first mobile electrodes are formed in the second structural layer and the fixed electrodes mutually arranged with the second mobile electrodes are formed in the first structural layer.

11. The MEMS device according to claim 1, wherein the articulation arm is a first articulation arm and the supporting region is a first supporting region, the MEMS device including:
a second articulation arm; and
wherein the electrostatic driving system includes third and fourth actuation assemblies that are arranged on opposite sides of the second articulation arm, and
wherein the second articulation arm couples the suspended mass to the second supporting region.

12. The MEMS device according to claim 11, comprising fifth and sixth actuation assemblies, each having mobile electrodes supported at least in part by the first and second articulation arms, respectively.

13. The MEMS device according to claim 11, wherein each of the actuation assemblies have longitudinal axes that extend parallel to each other and to the longitudinal axis of the first articulation arm.

14. The MEMS device according to claim 11, wherein the suspended mass is a micromirror having a reflecting surface, wherein a central axis of the reflecting surface rotates about the longitudinal axis of the first articulation arm and about a longitudinal axis of the second articulation arm.

15. The MEMS device according to claim 1, wherein the suspended mass has a shape chosen from among rectangular, rectangular with rounded edges, square, square with rounded edges, polygonal, circular, oval, and heart-shaped.

16. A picoprojector comprising:
a light source configured to emit light; and
a MEMS device configured to reflect the light, the MEMS device including:
   a suspended mass having a reflecting surface;
   a supporting region;
   an articulation arm having a first end coupled to the suspended mass and a second end coupled to the supporting region, the articulation arm having a longitudinal axis extending from the first end to the second end, the articulation arm having opposite sides that are opposed to each other relative to the longitudinal axis, the articulation arm and the suspended mass being configured to rotate about the longitudinal axis;
   connection elements coupled to the opposing sides of the articulation arm, respectively; and
   an electrostatic driving system including first and second actuation assemblies arranged on the opposing sides of the articulation arm and coupled to the articulation arm by the connection elements, each of the first and second actuation assemblies including mobile electrodes that are mutually arranged with fixed electrodes.

17. The picoprojector according to claim 16 wherein the light source is a laser light source.

18. The picoprojector according to claim 16 further comprising an optical lens configured to deflect the light emitted from the light source to the MEMS device.

19. The picoprojector according to claim 16 wherein the first and second actuation assemblies include auxiliary arms, wherein the mobile electrodes of the first and second actuation assemblies extend from the auxiliary arms, respectively.

20. The picoprojector according to claim 19 wherein the auxiliary arms have a longitudinal axis that is substantially parallel to the longitudinal axis of the articulation arm.

21. The picoprojector according to claim 16 wherein the connection elements are rigid arms.

22. The picoprojector according to claim 16 wherein the connection elements include hinges that allow first portions of the connection elements to move in a different direction than second portions of the connection elements.

23. A MEMS device comprising:
a suspended mass;
a supporting region;
first and second articulation arms extending from opposing sides of the suspended mass, the first and second articulation arms having first ends coupled to the suspended mass and second ends coupled to the supporting region, a longitudinal axis extending through the first and second articulation arms and the suspended mass, the first and second articulation arms and the suspended mass being configured to rotate together about the longitudinal axis;
first connection elements extending from the first articulation arm on sides that are opposite each other relative to the longitudinal axis;
second connection elements extending from the second articulation arm on sides that are opposite each other relative to the longitudinal axis;
first actuation assemblies coupled to the first articulation arm by the first connection elements, respectively; and
second actuation assemblies coupled to the second articulation arm by the second connection elements, respectively.

24. The MEMS device according to claim 23, wherein the first connection elements including hinges, respectively, that allow first portions of the first connection elements to move in different directions from the second portions of the first connection elements.

25. The MEMS device according to claim 23, wherein the second connection elements including hinges, respectively, that allow first portions of the second connection elements to move in different directions from the second portions of the second connection elements.

26. The MEMS device according to claim 25, wherein the first portions of the second connection elements are rigidly coupled to the second articulation arm and thus rotate about the longitudinal axis.

\* \* \* \* \*